United States Patent [19]
Koshizuka

[11] Patent Number: 5,274,260
[45] Date of Patent: Dec. 28, 1993

[54] SEMICONDUCTOR DEVICE

[75] Inventor: Atsuo Koshizuka, Tokyo, Japan

[73] Assignee: Nippon Steel Corporation, Tokyo, Japan

[21] Appl. No.: 751,991

[22] Filed: Aug. 29, 1991

[30] Foreign Application Priority Data

Aug. 30, 1990 [JP] Japan .................. 2-229769

[51] Int. Cl.$^5$ .......................... H01L 27/01
[52] U.S. Cl. .................... 257/338; 257/51; 257/335; 257/371; 257/622
[58] Field of Search ............. 357/23.7, 42, 59 E, 357/59 G; 257/51, 335, 338, 571, 622

[56] References Cited

U.S. PATENT DOCUMENTS

| | | | |
|---|---|---|---|
| 4,907,047 | 3/1990 | Kato et al. | 357/59 |
| 5,017,995 | 5/1991 | Soejima | 357/43 |

FOREIGN PATENT DOCUMENTS 61-63049  4/1986 Japan .
62-104173 5/1987 Japan .

*Primary Examiner*—Edward Wojciechowicz
*Attorney, Agent, or Firm*—Steven M. Rabin

[57] ABSTRACT

A latch up phenomenon is prevented by forming an insulating film on a semiconductor substrate, allowing a semiconductor layer to extend from both end portions of an opening provided in the insulating film on the semiconductor substrate onto the insulating film, forming a channel region within the opening, and utilizing semiconductor layers on the insulating film as a source and a drain. Further, in the semiconductor layer extending from the semiconductor substrate onto the insulating film, when the portion in contact with the semiconductor substrate is formed as a part of the inversion layer (channel), the width of the channel portion which utilizes the semiconductor substrate can be reduced, which enables a high-density integration to be realized.

18 Claims, 3 Drawing Sheets

SEMICONDUCTOR DEVICE

BACKGROUND OF THE INVENTION

1. Field of the Invention

The present invention relates to a metal insulator semiconductor (MIS) type semiconductor device.

2. Description of the Related Art

In the conventional semiconductor devices having a MIS structure, it is a common practice to form all of the source, drain and channel in a semiconductor substrate (see, for example, Japanese Unexamined Patent Publication (Kokai) No. 61-63049), or in the case of the formation of a transistor structure in a semiconductor layer grown on an insulating film, it is a common practice to form all of the source, drain and channel in the grown semiconductor layer (see, for example, Japanese Unexamined Patent Publication (Kokai) No. 62-104173).

In the above-described conventional semiconductor devices having a MIS structure, when all of the source, drain and channel are formed in a semiconductor substrate, it is necessary to form diffusion layers as the source and drain. In this case, since the lateral diffusion in the diffusion layer should be taken into consideration, it is difficult to reduce the channel length, and this inhibits a high-density integration. Further, when a complementary circuit is formed through the use of an element wherein the source, drain and channel all are formed in a semiconductor substrate, the device may be damaged due to the formation of a parasitic element.

On the other hand, when the source, drain and channel all are formed in a semiconductor layer on an insulating film, although a switching operation is possible, of the quality of the semiconductor layer is released and thus a leakage current exists in the off state.

SUMMARY OF THE INVENTION

The present invention has been made under the above-described circumstances, and an object of the present invention is to provide a semiconductor device capable of attaining a high-density integration.

Another object of the present invention is to provide a semiconductor device wherein the occurrence of leakage current in the off state can be prevented.

To attain the above-described objects of the present invention, according to one aspect of the present invention, there is provided a semiconductor device, comprising:

a) a semiconductor substrate of a first conductivity type;

b) a first insulating film formed on said semiconductor substrate and having an opening, said opening having first and second ends located opposite to each other;

c) a first semiconductor layer of the first conductivity type extending from said first end of said opening located on said semiconductor substrate onto said first insulating film;

d) a second semiconductor layer of the first conductivity type extending from said second end of said opening located on said semiconductor substrate onto said first insulating film;

e) a gate insulating film covering the remaining surface area of said semiconductor substrate in said opening and not covered by said first and second semiconductor layers and surfaces of said first and second semiconductor layers, said first and second semiconductor layers and a region of said semiconductor substrate located under said gate insulating film forming a channel region (inversion layer);

f) a gate electrode formed on said gate insulating film;

g) a source semiconductor layer of a second conductivity type opposite to the first conductivity type, said source semiconductor layer being formed in contact with said first semiconductor layer on said first insulating layer; and h) a drain semiconductor layer of the second conductivity type formed in contact with said second semiconductor layer on said first insulating film.

According to another aspect of the present invention, there is provided a semiconductor device, comprising:

a) a semiconductor substrate of a first conductivity type;

b) a first insulating film formed on said semiconductor substrate and having an opening, said opening having first and second ends located opposite to each other;

c) a first semiconductor layer of the first conductivity type in contact with said semiconductor substrate on the side of said first end of said opening and extending onto said first insulating film;

d) a second semiconductor layer of the first conductivity type in contact with said semiconductor substrate on the side of said second end of said opening and extending onto said first insulating film;

e) a second insulating film covering the remaining surface area of said semiconductor substrate within said opening which is not used for connection to said first and second semiconductor layers;

f) a third semiconductor layer of a second conductivity type opposite to the first conductive type, said third semiconductor layer being formed in contact with said first semiconductor layer on said first insulating layer; and g) a fourth semiconductor layer of the second conductivity type, said fourth semiconductor layer being formed in contact with said second semiconductor layer on said first insulating film.

According to a further aspect of the present invention, there is provided a semiconductor device, comprising:

a) a semiconductor substrate;

b) a first insulating layer formed on said semiconductor substrate in such a manner that said first insulating layer is in contact with a part of said semiconductor substrate;

c) a second insulating layer formed on said semiconductor substrate while leaving a predetermined gap between said first and second insulating layers;

d) a third insulating layer formed on said semiconductor substrate and opposite to said second insulating layer in relation to said first insulating layer while leaving a predetermined gap between the second and third insulating layers e) a first semiconductor layer formed on said second insulating layer and in contact with said semiconductor substrate at a gap formed between said first insulating layer and said second insulating layer; and f) a second semiconductor layer formed on semiconductor substrate at a gap formed between said first insulating layer and said third insulating layer.

According to a further aspect of the present invention, there is provided a semiconductor device, comprising a semiconductor substrate and, provided thereon, A) a first transistor and B) a second transistor complementary to said first transistor, A) said first transistor having:

a) a semiconductor substrate of a first conductivity type, b) a first insulating layer formed on said semiconductor substrate in such a manner that insulating layer is in contact with a part of said semiconductor substrate;

c) a second insulating layer formed on said semiconductor substrate while leaving a predetermined gap between said first and second insulating layers;

d) a third insulating layer formed on said semiconductor substrate and opposite to said second insulating layer in relation to said first insulating layer while leaving a predetermined gap between the second and third insulating layers;

e) a first semiconductor layer formed on said second insulating layer and in contact with said semiconductor substrate at a gap formed between said first insulating layer and said second insulating layer; and f) a second semiconductor layer formed on said third insulating layer and in contact with said semiconductor substrate at a gap formed between said first insulating layer and said third insulating layer, B) said second transistor having:

a) a third semiconductor layer formed on said semiconductor substrate of the first conductivity type, said third semiconductor layer being of a second conductivity type opposite to the first conductivity type;

b) a fourth insulating layer formed on said third semiconductor layer in such a manner that said fourth insulating layer is in contact with a part of said third semiconductor layer;

c) a fifth insulating layer formed on said third semiconductor layer while leaving a predetermined gap between said fourth and fifth insulating layers;

d) a sixth insulating layer formed on said third semiconductor layer and opposite to said fifth insulating layer in relation to said fourth insulating layer while leaving a predetermined gap between said fifth and sixth insulating layers;

e) a fourth semiconductor layer formed on said fifth insulating layer and in contact with said third semiconductor layer at a gap formed between said fourth insulating layer and said fifth insulating layer; and f) a fifth semiconductor layer formed on said sixth insulating layer and in contact with said third semiconductor layer at a gap formed between said fourth insulating layer and said sixth insulating layer.

According to a further aspect of the present invention, there is provided a complementary semiconductor device comprising a semiconductor substrate and, provided thereon, A) an n-channel transistor and B) a p-channel transistor, A) said n-channel transistor having:

a) an n-type semiconductor substrate;

b) a first insulating film formed on said semiconductor substrate and having a first opening, said first opening having first and second ends located opposite to each other;

c) a first n-type semiconductor layer extending from said first end of said first opening located on said semiconductor substrate onto said first insulating film;

d) a second n-type semiconductor layer extending from said second end of said first opening located on said semiconductor substrate onto said first insulating film;

e) a first gate insulating film covering the remaining surface area of said semiconductor substrate within said opening and not covered by said first and second n-type semiconductor layers and the surface of said first and second n-type semiconductor layers, said first and second n-type semiconductor layers and a region of said semiconductor substrate located under said gate insulating film forming a channel region;

f) a gate electrode formed on said first gate insulating film;

g) a p-type semiconductor layer formed in contact with said first n-type semiconductor layer on said first insulating layer; and h) a p-type semiconductor layer formed in contact with said second n-type semiconductor layer on said first insulating film, B) said p-channel transistor having:

a) a p-type region formed in said semiconductor substrate;

b) a second insulating film formed on said p-type region and having a second opening, said second opening having third and fourth ends located opposite to each other;

c) a first p-type semiconductor layer extending from said third end of said second opening located on said p-type region onto said second insulating film;

d) a second p-type semiconductor layer extending from said fourth end of said second opening located on said p-type region onto said second insulating film;

e) a second gate insulating film covering the remaining surface area of said semiconductor substrate within said second opening and not covered by said first and second p-type semiconductor layers and the surface of said first and second p-type semiconductor layers, said first and second p-type semiconductor layers and a region of said p-type region located under said second gate insulating film forming a channel region;

f) a second gate electrode provided on said second gate insulating film;

g) an n-type semiconductor layer formed in contact with said first p-type semiconductor layer on said second insulating film; and h) a n-type semiconductor layer formed in contact with said second p-type semiconductor layer on said second insulating film.

DESCRIPTION OF THE PREFERRED EMBODIMENTS

Embodiments of the present invention will now be described.

Figure 1:
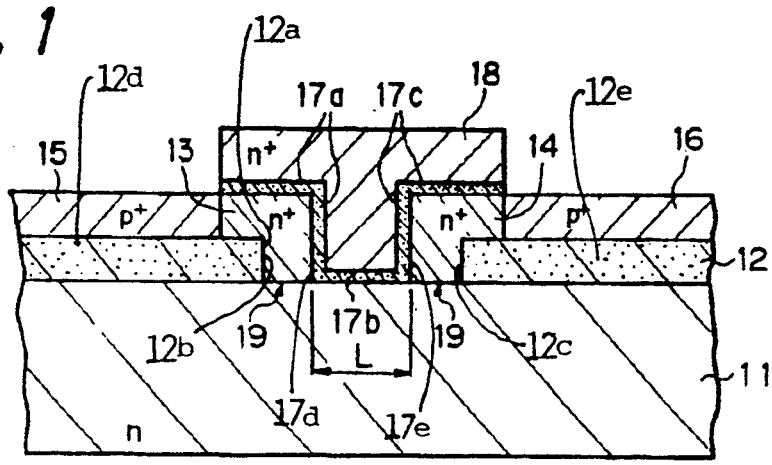
FIG. 1 is a schematic cross-sectional view of a semiconductor device of the first embodiment of the present invention.

FIG. 1 is a schematic cross-sectional view of an example of the construction of a MIS transistor as a the first embodiment of the present invention.

In the MIS transistor of this embodiment, an insulating film 12 comprising SiO$_2$ is formed on a semiconductor substrate 11 comprising an n-type silicon crystal. The insulating film 12 at substantially a center portion thereof in the drawing is removed to form an opening 12a. Polysilicon films or layers 13, 14 of the same type (n-type) as that of the semiconductor substrate 11 are formed so as to extend from the respective opposite sides 12b and 12c of the opening 12a onto the insulating film 12. Two + p -type polysilicon films or layers 15, 16 are formed on the respective insulating films 12d and 12e of the insulating film 12 so as to contact, and extend from the polysilicon films 13, 14. The p$^+$-type polysilicon films 15, 16 serve as a source and a drain, respectively. Gate oxide films 17a, 17b, 17c comprising SiO$_2$ are formed on the surface of the n-type polysilicon films 13, 14 and the surface 11a of the semiconductor substrate 11 exposed where the insulating film 12 has been removed. Opposing sides of the insulating films 17 and 12d define a first predetermined gap 17d in which the polysilicon film 13 is provided. Opposing sides of the insulating films 17 and 12e define a second gap 17e in which the polysilicon film 14 is provided. Further, an n+type polysilicon film 18 is formed on the surface thereof. The n$^+$-type polysilicon film 18 serves as a gate. Thus, in this transistor, the gate oxides films 17a, 17c are formed on the insulating material 12, while the gate oxide film 17b is formed on the semiconductor substrate 11. Part of the n-type polysilicon films 13, 14 serves as part of the channel.

In the above-described construction, the semiconductor substrate 11 is of the n-type, and the polysilicon films 13, 14 in contact with the semiconductor substrate 11 also become n-type. Thus, since materials of the same conductivity type come into contact with each other, the diffusion of impurities through a contact plane 19 of both materials can be prevented. Therefore, according to the present invention, the channel length L of the gate oxide film 17b formed in contact with the semiconductor substrate 11, can be reduced, while the sizes of the source and drain 15, 16 do not significantly vary depending upon the presence of the polysilicon films 13, 14, which enables the size of the MIS transistor to be reduced on the whole, so that a high-density integration becomes possible.

Figure 2A:
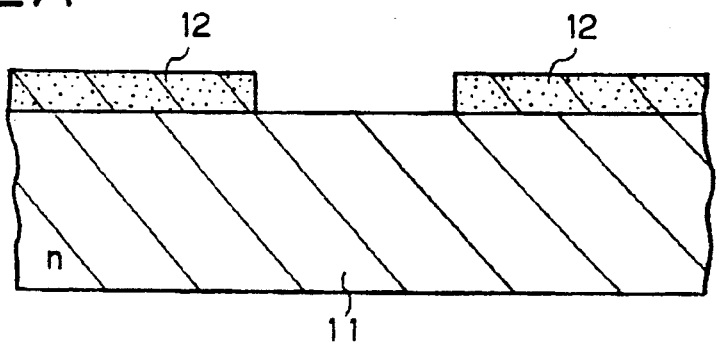
FIG. 2 is a schematic cross-sectional view showing the main steps of manufacturing a semiconductor device shown in FIG. 1.

FIG. 2 is a schematic cross-sectional view showing the main steps of manufacturing the semiconductor device shown in FIG. 1. At the outset, in a step shown in FIG. 2A, an insulating film 12 comprising SiO$_2$ is formed on an n-type semiconductor substrate 11, and the insulating film at a predetermined portion thereof is removed.

Figure 2B:
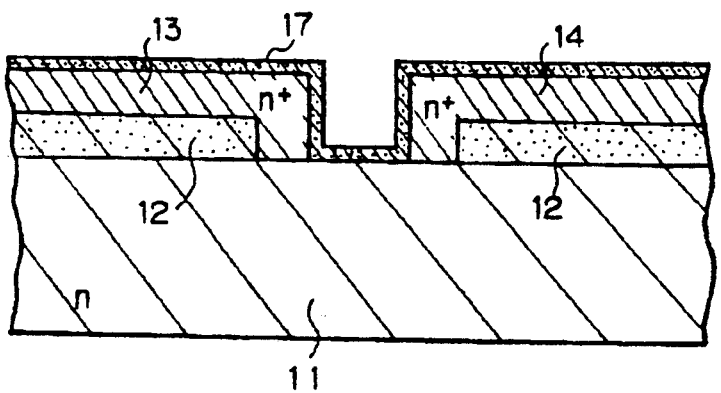

Then, in a step shown in FIG. 2B, an n$^+$-type semiconductor material 13, 14 is formed over all of the surface of the insulating film 12, and the semiconductor substrate 11 at the exposed portion thereof. The semiconductor material 13, 14 at a predetermined portion formed directly on the semiconductor substrate 11 is removed to expose the semiconductor substrate 11. Further, a gate oxide film 17 is formed over all of the surface of the n$^+$-type semiconductor materials 13, 14 and the exposed portion of semiconductor substrate 11.

Figure 2C:
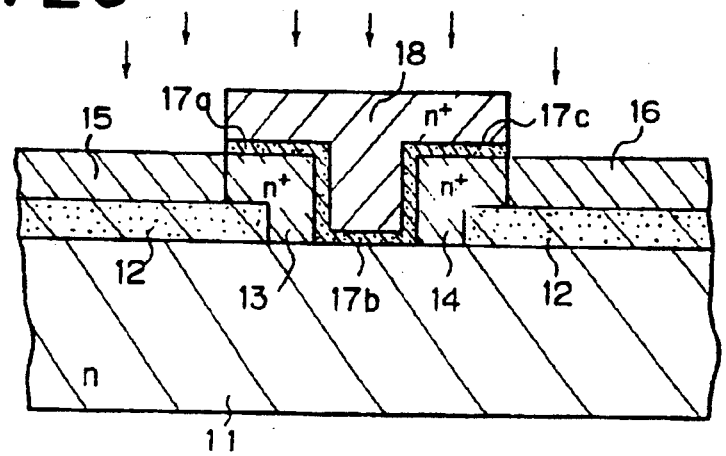

Then, in a step shown in FIG. 2C, an n$^+$-type semiconductor layer 18 is formed over all of the surface of the gate oxide film 17. Much of semiconductor layer 18 and gate oxide film 17 is then removed while leaving only a predetermined portion to be served as a gate. Thereafter, a p-type impurity is implanted from above to form p$^+$-type semiconductor regions 15, 16 in the n$^+$-type semiconductor layers 13, 14 at positions where the gate oxide film 17 has been removed. The p$^+$-type semiconductor layer 15 and the p$^+$-type semiconductor layer 16 are used as a source and a drain, respectively, or alternatively used as a drain and a source, respectively.

Figure 3:
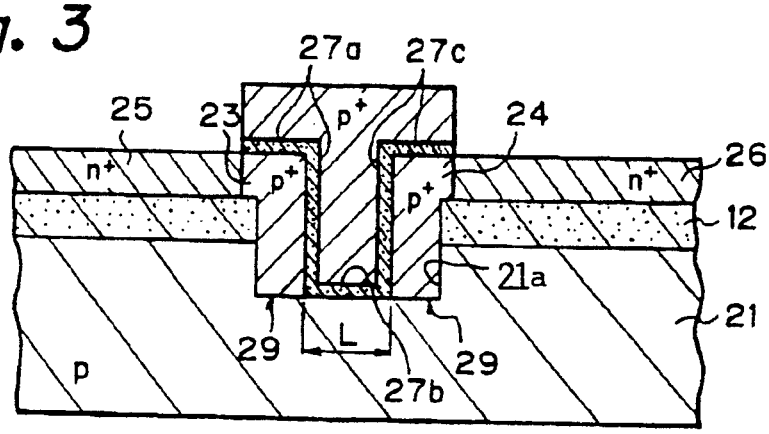
FIG. 3 is a schematic cross-sectional view of a semiconductor device of the second embodiment of the present invention.

FIG. 3 is a schematic cross-sectional view of an example of the construction of an MIS transistor which is the second embodiment of the present invention. In the drawing, a part having the same function as that shown in FIG. 1 is indicated by the same reference character, and thus a detailed description thereof is omitted.

The first difference of the present embodiment from the first embodiment shown in FIG. 1 resides in that a semiconductor substrate 21 comprises a p-type silicon crystal substrate. The next difference resides in that polysilicon films 23, 24, polysilicon films 25, 26 and a polysilicon film 28 are of p-type, n$^+$-type and p$^+$-type, respectively, i.e., the relationship between the conductive types (p-type or n-type) is opposite to that in the case of the first embodiment. Further, the present embodiment is different from the first embodiment in that a portion of the semiconductor substrate 21 is removed to provide a central trench or recess 21a, and further, the width of the recess is narrower. The reason why the semiconductor substrate is provide provided with the central recess is that the length of the polysilicon transistor portions 23, 24 is increased to allow a reduction of the length L. Gate oxide films 27a, 27b, 27c are constructed in the same manner as the gate oxide films 17a, 17b and 17c of the first embodiment.

Other functions and effects of the present embodiment are the same as those of the first embodiment.

Figure 4:
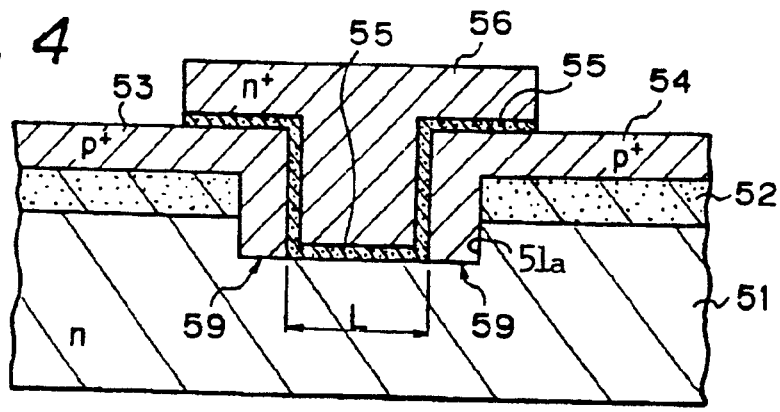
FIG. 4 is a schematic cross-sectional view of a semiconductor device of the third embodiment of the present invention.

FIG. 4 shows the third embodiment of the present invention which enables the occurrence of a leakage current in the off state to be prevented. As with the second embodiment shown in FIG. 3, in the basic construction shown in FIG. 4, a portion of the semiconductor substrate is removed to provide a central trench or recess. This construction, however, is not essential to the present invention.

The transistor shown in FIG. 4 comprises an insulating film 52 comprising SiO$_2$ or the like formed on, for example, an n-type semiconductor substrate 51; a drain 53 and a source 54 each comprising a p-type polysilicon or the like formed so as to extend from on the insulating film 52 to the periphery of the recess 51a in portion of portion of the semiconductor substrate 51 located at a central portion of this drawing; an oxide film 55 formed so as to extend to the bottom surface of the recess 51a the semiconductor substrate 51 and along the surface of the drain 53 and the source 54; and a gate 56 formed in contact with the oxide film 55. In the transistors as shown in FIGS. 1, 3 and 4, wherein a recess is formed in a semiconductor substrate and a source and a drain are formed on an insulating film, the junction capacitance becomes zero because the source and the drain are formed on the insulating film but not in the semiconductor substrate. Therefore, the construction of a complementary circuit through the use of this structure can advantageously eliminate a latch up phenomenon. When the source 53 and drain 54 of a conductive type different from that of the semiconductor substrate 51 are partly made in contact with the semiconductor substrate 51 as shown in FIG. 4, for example, if the semiconductor substrate 51 is p-type, the source 53 and the drain 54 become n-type, which causes impurities to be diffused in a contact plane 59 between the source 53 and the drain 54 and the semiconductor substrate 51. This leads to a difficulty of making the channel length L smaller than that of the structures of the embodiments shown in FIGS. 1 and 3, and this may inhibit high-density integration.

In the above-described embodiments, specified materials are used, but, it is obvious that the materials of the MIS transistor of the present invention are not limited to the above-described materials, and the transistor may be constructed in various ways through the use of known crystalline and amorphous semiconductor materials.

Figure 5:
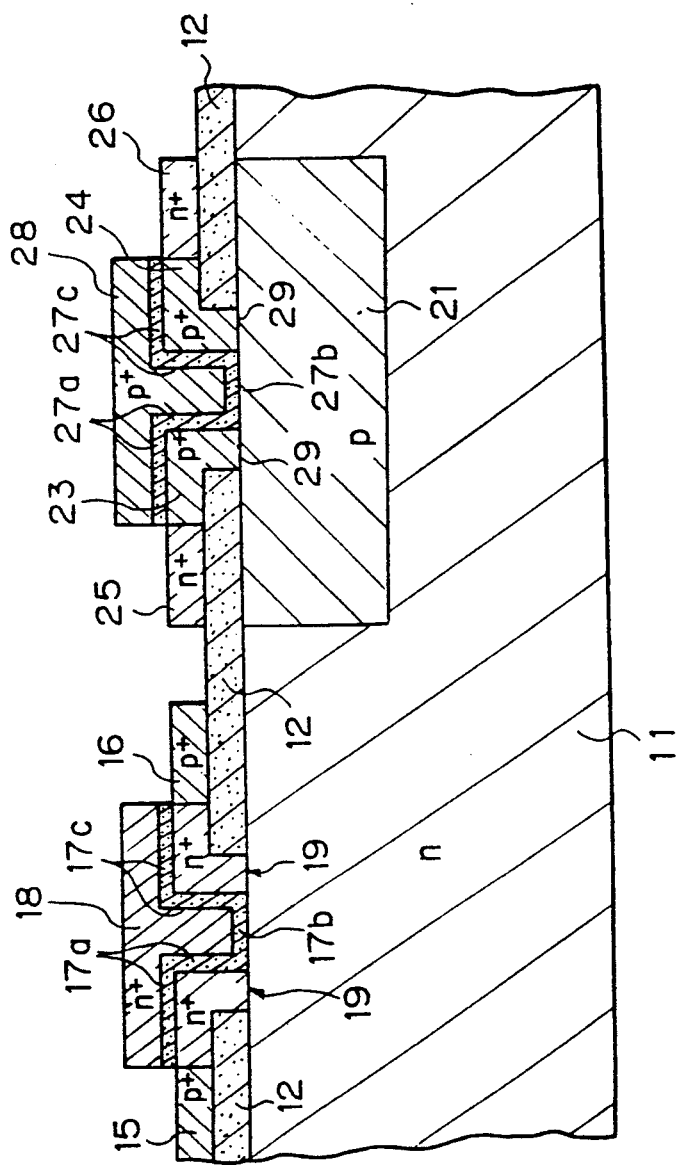
FIG. 5 is a schematic cross-sectional view of a semiconductor device of the fourth embodiment of the present invention.

Further, it is possible to construct a complementary semiconductor device by forming two types of transistors of the embodiments shown in FIGS. 1 and 3 on the same substrate. FIG. 5 shows a cross-sectional view of the construction of this embodiment. In the embodiment shown in FIG. 5, a part having the same construction as that shown in FIGS. 1 and 3, is indicated by the same reference character. In the present embodiment, use is made of an n-type semiconductor substrate, a p-type semiconductor region is formed within the semiconductor substrate, and a transistor of the type shown in FIG. 1 and a transistor of the type shown in FIG. 3 are provided on an n-type semiconductor region and a p-type semiconductor region, respectively. Note, the p-channel transistor as shown in FIG. 3 is not formed with an opening in the substrate in the embodiment shown in FIG. 5, for a simplification of the construction.

I claim:

1. A semiconductor device, comprising:
   a semiconductor substrate of a first conductivity type;
   a first insulating film formed on said substrate, said first insulating film having an opening which exposes a surface of said substrate, said opening having opposite first and second sides;
   a first semiconductor layer of the first conductivity type, within said opening, said first semiconductor layer covering a portion of said surface adjacent said first side, said first semiconductor layer extending from said opening onto said first insulating film;
   a second semiconductor layer of the first conductivity type, within said opening, said second semiconductor layer covering a portion of said surface adjacent said second side, said second semiconductor layer extending from said opening onto said first insulating film;
   a second insulating film covering said first and second semiconductor layers and covering the remaining portion of said surface not covered by said first and second semiconductor layers, said first and second semiconductor layers and a region of said substrate under said second insulating film together forming a channel region;
   a gate electrode formed on said second insulating film;
   a source semiconductor layer of a second conductivity type opposite to said first conductivity type, said source layer formed on said first insulating film so as to contact said first semiconductor layer on said first insulating film; and
   a drain semiconductor layer of the second conductivity type, said drain layer formed on said first insulating film so as to contact said second semiconductor layer on said first insulating film.

2. A semiconductor device according to claim 1 wherein said substrate has a recess for connection to said second insulating film and said first and second semiconductor layers.

3. A semiconductor device according to claim 1, wherein said first and second semiconductor layers comprise polysilicon.

4. A semiconductor device according to claim 1, wherein said first conductive type is n-type.

5. A semiconductor device according to claim 1, wherein said first conductive type is p-type.

6. A semiconductor device, comprising:
   a semiconductor substrate of a first conductivity type;
   a first insulating film formed on said substrate, said first insulating film having an opening which exposes a surface of said substrate, said opening having opposite first and second sides;
   a first semiconductor layer of the first conductivity type, within said opening, said first semiconductor layer contacting said surface adjacent said first side, said first semiconductor layer extending from said opening onto said first insulating film;
   a second semiconductor layer of the first conductivity type, within said opening, said second semiconductor layer contacting said surface adjacent said second side, said second semiconductor layer extending from said opening onto said first insulating film;
   a second insulating film covering the remaining portion of said surface not contacted by said first and second semiconductor layers, a channel region being formed in said substrate beneath said second insulating film;
   a gate electrode formed on said second insulating film;
   a source semiconductor layer of a second conductivity type opposite to said first conductivity type, said source layer formed on said first insulating film so as to contact said first semiconductor layer on said first insulating film; and
   a drain semiconductor layer of the second conductivity type, said drain layer formed on said first insulating film so as to contact said second semiconductor layer on said first insulating film.

7. A semiconductor device according to claim 6, wherein said gate electrode comprises a semiconductor layer of the first conductivity type.

8. A semiconductor device according to claim 6, wherein said second insulating film further covers said first and second semiconductor layers.

9. A semiconductor device according to claim 6, wherein said semiconductor substrate has a recess for connection to said second insulating film and said first and second semiconductor layers.

10. A semiconductor device, comprising:
    a semiconductor substrate, said substrate with neither source region not drain region therein;
    a first insulating film formed on said substrate so as to be in contact with a part thereof, a channel being formed in said substrate beneath said first insulating film;

a gate electrode on said first insulating film;

a second insulating film formed on said substrate in spaced relation to said first insulating film so as to define a first predetermined gap between said first and second insulation films;

a third insulating film formed on said substrate in spaced relation to said first insulating film so as to define a second predetermined gap between said third and first insulation films, said first and second gaps on opposite sides of said first insulating film;

a first semiconductor layer, including a source, said first semiconductor layer formed on said second insulating film and contacting said substrate in said first gap; and a second semiconductor layer, including a drain, said second semiconductor layer formed on said third insulating film and contacting said substrate in said second gap.

11. A semiconductor device according to claim 10, wherein said gate electrode comprises a semiconductor layer.

12. A semiconductor device according to claim 10, wherein said first insulating film further covers a part of said first and second semiconductor layers.

13. A semiconductor device according to claim 10, wherein said semiconductor substrate has a recess for connection to said first insulating film and said first and second semiconductor layers.

14. A semiconductor device according to claim 10, wherein said first and second semiconductor layers are of a conductive type different from that of said semiconductor substrate.

15. A semiconductor device according to claim 14, wherein said first and second semiconductor layers each have in a region connected to said semiconductor substrate forming a third semiconductor layer of the same conductive type as that of said semiconductor substrate.

16. A semiconductor device, comprising:
a first transistor, including
a semiconductor substrate of a first conductivity type, said first substrate with neither source region nor drain region therein,
a first insulating film formed on said substrate so as to be in contact with a part thereof, a channel being formed in said substrate beneath said first insulating film,
a gate electrode on said first insulating film,
a second insulating film formed on said substrate in spaced relation to said first insulating film so as to define a first predetermined gap between said first and second insulation films,
a third insulating film formed on said substrate in spaced relation to said first insulating film so as to define a second predetermined gap between said third and first insulation films, said first and second gaps on opposite sides of said first insulating film,
a first semiconductor layer, including a source, said first semiconductor layer formed on said second insulating film and contacting said substrate in said first gap, and
a second semiconductor layer, including a drain, said second semiconductor layer formed on said third insulating film and contacting said substrate in said second gap; and a second transistor, complementary to said first transistor, including
a semiconductor region on said substrate, said semiconductor region of a second conductivity type opposite to said first conductivity type, said semiconductor region with neither source region nor drain region therein,
a fourth insulating film formed on said semiconductor region so as to be in contact with a part thereof, a second channel being formed in said semiconductor region beneath said fourth insulating film,
a second gate electrode on said fourth insulating film,
a fifth insulating film formed on said semiconductor region in spaced relation to said fourth insulating film so as to define a third predetermined gap between said fourth and fifth insulation films,
a sixth insulating film formed on said semiconductor region in spaced relation to said fourth insulating film so as to define a fifth predetermined gap between said sixth and fourth insulating films, said third and fourth gaps on opposite sides of said fourth insulating film,
a third semiconductor layer, including a second source, said third semiconductor layer formed on said fifth insulating film and contacting said semiconductor region in said third gap, and
a fourth semiconductor layer, including a second drain, said fourth semiconductor layer formed on said sixth insulating film and contacting said semiconductor region in said fourth gap.

17. A semiconductor device according to claim 16, wherein
only first portions of the first and second semiconductor layers contact the substrate in said first and second gaps, said first portions formed of semiconductor material of the first conductivity type,
remaining, second portions of the first and second semiconductor layers, on said second and third insulating films, contacting said first portions above the first and second gaps and being formed of semiconductor material of the second conductivity type,
only third portions of the third and fourth semiconductor layers contacting the semiconductor region in the third and fourth gaps, said third portions formed of semiconductor material of the second conductivity type,
remaining, fourth portions of the third and fourth semiconductor layers, on said fifth and sixth insulating films, contacting said third portions above the third and fourth gaps and being formed of semiconductor material of the first conductivity type.

18. A complementary semiconductor device, comprising:
an n-channel transistor, including
an n-type semiconductor substrate,
a first insulating film formed on said n-type substrate, said first insulating film having an opening which exposes a first surface of said n-type substrate, said first opening having opposite first and second sides,
a first n-type semiconductor layer within said opening, said first n-type semiconductor layer covering a portion of said first surface adjacent said first side, said first n-type semiconductor layer extending from said first opening onto said first insulating film, a second n-type semiconductor layer within said first opening, said second n-type semiconductor layer covering a portion of said first surface adjacent said second side, said second n-type semiconductor layer extending from said first opening onto said first insulating film, a second insulating film covering the remaining portion of said first surface not covered by said first and second n-type semiconductor layers, a first channel region being formed under said second insulating film, a first gate electrode on said first second insulating film, a p-type source layer formed on said first insulating film so as to contact said first n-type semiconductor layer on said first insulating film, and a p-type drain layer formed on said first insulating film so as to contact said second n-type semiconductor layer on said first insulating film; and a p-type transistor, including a p-type region on said substrate, a third insulating film formed on said p-type region, said third insulating film having a second opening which exposes a second surface of said p-type region, said second opening having opposite third and fourth sides, a first p-type semiconductor layer within said second opening, said first p-type semiconductor layer covering a portion of said second surface adjacent said third side, said first p-type semiconductor layer extending from said second opening onto said third insulating film, a second p-type semiconductor layer within said second opening, said second p-type semiconductor layer covering a portion of said second surface adjacent said fourth side, said second p-type semiconductor layer extending from said second opening onto said third insulating film, a fourth insulating film covering the remaining portion of said second surface not covered by said first and second p-type semiconductor layers, a second channel region being formed under said fourth insulating film, a second gate electrode on said fourth insulating film, an n-type source layer formed on said third insulating film so as to contact said first p-type semiconductor layer on said third insulating film, and an n-type drain layer formed on said third insulating film so as to contact said second p-type semiconductor layer on said third insulating film.

* * * * *